US 8,865,510 B2

(12) United States Patent
Takahama et al.

(10) Patent No.: US 8,865,510 B2
(45) Date of Patent: Oct. 21, 2014

(54) METHOD OF MANUFACTURING SOLAR CELL

(71) Applicant: SANYO Electric Co., Ltd., Moriguchi (JP)

(72) Inventors: Tsuyoshi Takahama, Neyagawa (JP); Hiroyuki Mori, Kaizuka (JP); Kei Tamoto, Izumiotsu (JP)

(73) Assignee: SANYO Electric Co., Ltd., Moriguchi (JP)

( * ) Notice: Subject to any disclaimer, the term of this patent is extended or adjusted under 35 U.S.C. 154(b) by 0 days.

(21) Appl. No.: 13/848,192

(22) Filed: Mar. 21, 2013

(65) Prior Publication Data

US 2013/0210187 A1     Aug. 15, 2013

Related U.S. Application Data

(63) Continuation of application No. PCT/JP2011/068374, filed on Aug. 11, 2011.

(30) Foreign Application Priority Data

Sep. 27, 2010     (JP) ................................. 2010-215917

(51) Int. Cl.
  *H01L 21/00*     (2006.01)
  *H01L 31/0747*     (2012.01)
  *H01L 31/068*     (2012.01)
  *H01L 31/0236*     (2006.01)
  *H01L 31/0224*     (2006.01)
  *H01L 31/20*     (2006.01)

(52) U.S. Cl.
  CPC ...... *H01L 31/02363* (2013.01); *H01L 31/0747* (2013.01); *H01L 31/0682* (2013.01); *Y02E 10/547* (2013.01); *H01L 31/022441* (2013.01); *H01L 31/202* (2013.01)

USPC ................................................ 438/71; 438/98

(58) Field of Classification Search
  CPC ............................................... H01L 31/022441
  USPC ............ 438/57, 745, 71, 98, 755; 257/13, 21, 257/E33.001, E31.103, 79, 225
  See application file for complete search history.

(56) References Cited

U.S. PATENT DOCUMENTS 8,257,994 B2 * 9/2012 Funakoshi ....................... 438/57
  2011/0303904 A1 * 12/2011 Avasthi et al. .................. 257/40

FOREIGN PATENT DOCUMENTS

| JP | 2006-324590 A | 11/2006 |
| JP | 2008-010746 A | 1/2008 |
| JP | 2008010746 | * 1/2008 |
| JP | 2010-080887 A | 4/2010 |

* cited by examiner

*Primary Examiner* — Jarrett Stark
*Assistant Examiner* — Shahed Ahmed
(74) *Attorney, Agent, or Firm* — Marvin A. Motsenbocker; Mots Law, PLLC

(57) ABSTRACT

A solar cell is manufactured, which includes: a solar cell substrate including a semiconductor substrate, a p-type surface and an n-type surface exposed on a first principal surface, and a texture structure in a second principal surface; a p-side electrode disposed on the p-type surface; an n-side electrode disposed on the n-type surface; and an insulation layer formed on the first principal surface and isolating the p-side electrode and the n-side electrode from each other. The manufacturing method of the solar cell includes: forming an insulation film covering the first principal surface; forming the texture structure in the second principal surface; and removing part of the insulation film, thereby forming the insulation layer.

10 Claims, 7 Drawing Sheets

METHOD OF MANUFACTURING SOLAR CELL

CROSS REFERENCE TO RELATED APPLICATIONS

This application is a continuation application of International Application No. PCT/JP2011/068374, filed on Aug. 11, 2011, entitled "METHOD OF MANUFACTURING SOLAR CELL", which claims priority based on Article 8 of Patent Cooperation Treaty from prior Japanese Patent Applications No. 2010-215917, filed on Sep. 27, 2010, the entire contents of which are incorporated herein by reference.

BACKGROUND OF THE INVENTION

1. Field of the Invention

This disclosure relates to a method of manufacturing a solar cell. In particular, this disclosure relates to a method of manufacturing a back contact solar cell.

2. Description of Related Art

Heretofore, a so-called interdigitated back contact solar cell having p-type and n-type semiconductor regions formed on a back surface side of the solar cell has been known (Patent Document 1 described below, for example). In this back contact solar cell, electrodes do not need to be provided on a light-receiving surface side. Thus, in a back contact solar cell, light-receiving efficiency can be improved and thereby improved power generation efficiency can be achieved.

Patent Document 1: Japanese Patent Application Publication No. 2010-80887

SUMMARY OF THE INVENTION

In a back contact solar cell, it is important to improve light-receiving efficiency on a light-receiving surface in order to improve photoelectric conversion efficiency. To achieve this, formation of a fine bumpy structure, called a texture structure, in the light-receiving surface of a semiconductor substrate is preferable to reduce the optical reflectance of the light-receiving surface and to increase the optical absorptance of the semiconductor substrate. On the other hand, in the back contact solar cell, n-type and p-type semiconductor regions are formed on the back surface in a highly precise manner. Accordingly, it is preferable to keep the back surface as flat as possible without forming a text structure therein.

A texture structure is formed in one principal surface of a semiconductor substrate, which is to be a light-receiving surface, while the other principal surface, which is to be a back surface, is protected by a protection layer. After that, the protection layer is removed, and then a semiconductor junction and the like are formed on the other principal surface, which is to be the back surface of the semiconductor substrate. In this way, in order to form the texture structure in the light-receiving surface of the back contact solar cell, it is necessary to form the protection layer on the principal surface of the semiconductor substrate, which is to be the back surface, and to remove the protection layer after the texture structure is formed. For this reason, a back contact solar cell having a textured light-receiving surface is manufactured through complicated manufacturing steps.

An embodiment of the invention is made in view of the above point, and aims to provide a method of manufacturing a back contact solar cell including a solar cell substrate with a textured light-receiving surface, easily and in fewer manufacturing steps.

A method of manufacturing a solar cell according to an aspect of the invention relates to a solar cell includes: a solar cell substrate including a semiconductor substrate; a first principal surface having a p-type surface and an n-type surface exposed; and a textured second principal surface; a p-side electrode disposed on the p-type surface; an n-side electrode disposed on the n-type surface; and an insulation layer formed on the first principal surface and isolating the p-side electrode and the n-side electrode from each other. The manufacturing method according to the aspect includes: forming an insulation film covering the first principal surface, and then forming the texture structure in the second principal surface; and removing part of the insulation film, and thereby forming the insulation layer.

Effects of the Invention

The aspect of the invention can provide a method of manufacturing a back contact solar cell including a solar cell substrate with a textured light-receiving surface, easily and in fewer manufacturing steps.

DETAILED DESCRIPTION OF EMBODIMENTS

Figure 1:
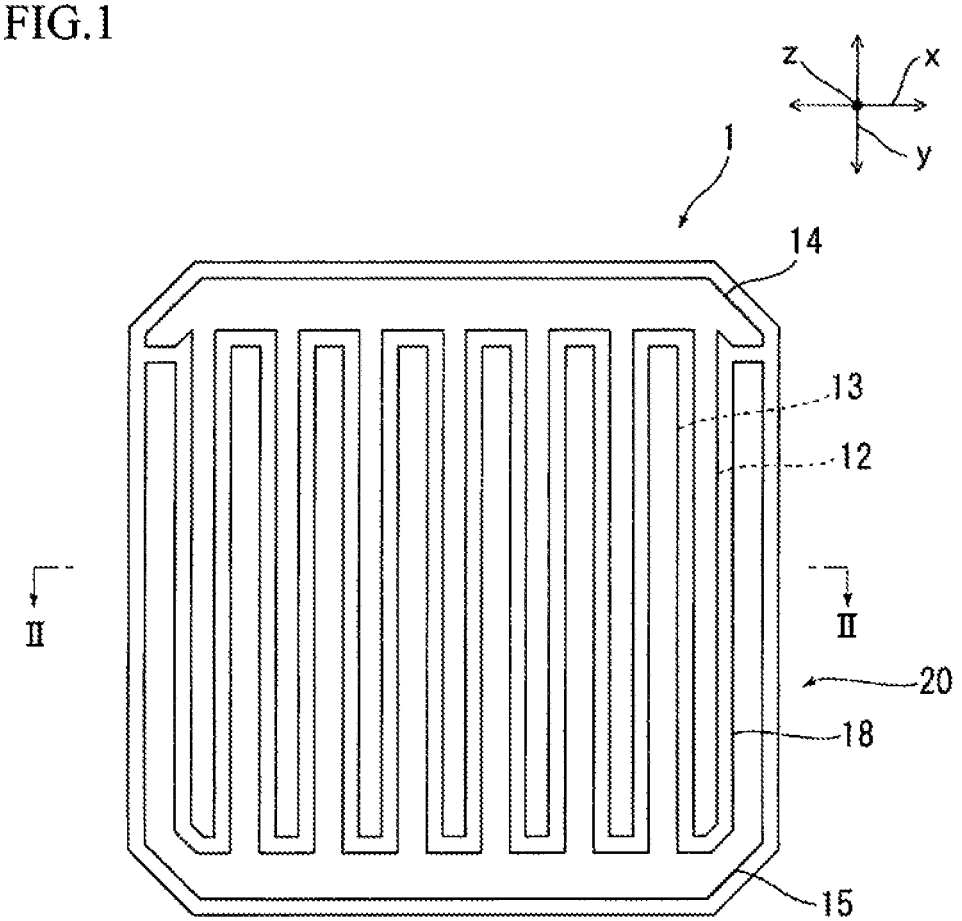
FIG. 1 is a schematic plan view of a solar cell according to a first embodiment.

Hereinafter, an example of preferred embodiments of the invention is described. Note, however, that the embodiments described below are only an example. The invention is not limited to the embodiments below in any way.

In addition, in the drawings referenced in the embodiments and the like, members having substantially the same functions are given the same reference numerals. Further, the drawings referenced in the embodiments and the like are schematic. Hence, dimensional ratios and the like of objects depicted in the drawings may be different from actual dimensional ratios and the like of the objects. The dimensional ratios and the like of the objects in the drawings maybe different among the drawings as well. Thus, specific dimensional ratios and the like of the objects should be determined in consideration of the following description.

<First Embodiment>

(Configuration of Solar Cell 1)

First of all, the configuration of solar cell 1 manufactured in this embodiment is described in detail with reference to FIGS. 1 and 2.

Solar cell 1 is a back contact solar cell. Note that, if a sufficient output cannot be obtained from single solar cell 1 of this embodiment, a solar cell module made by connecting multiple solar cells 1 with wiring members may be used.

Figure 2:
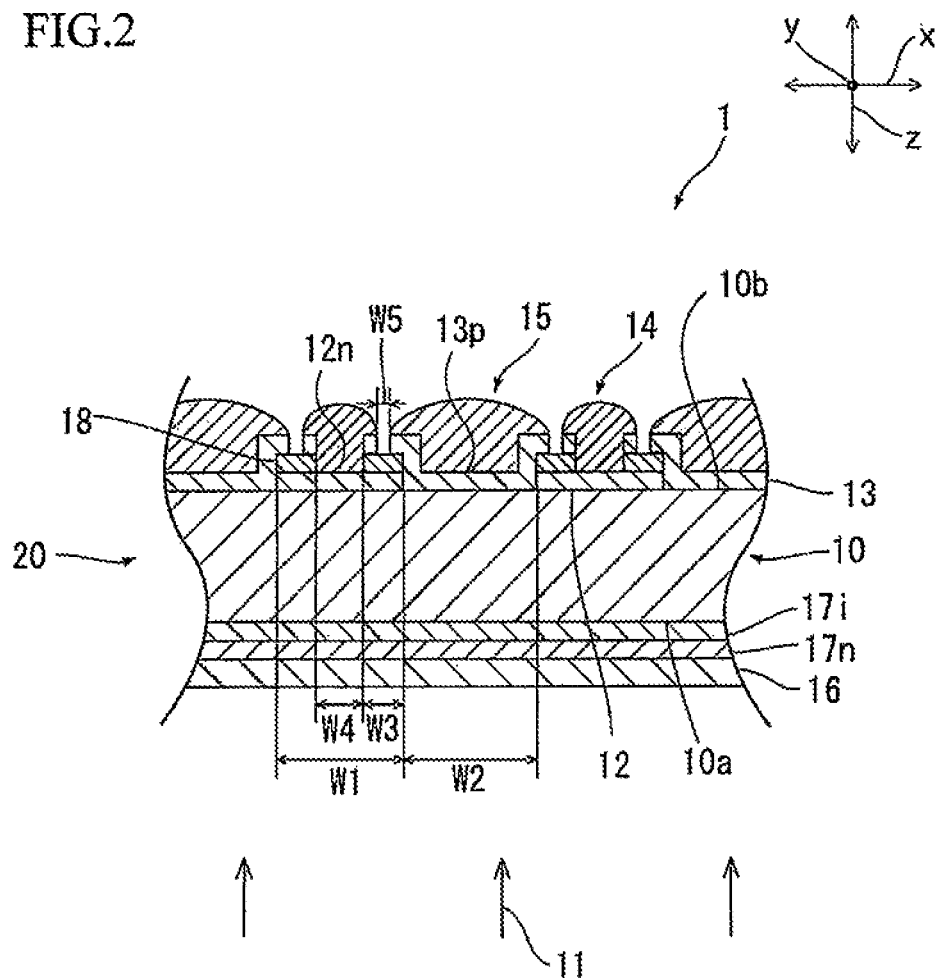
FIG. 2 is a schematic cross-sectional view of the solar cell taken along the line II-II of FIG. 1.
Figure 3:
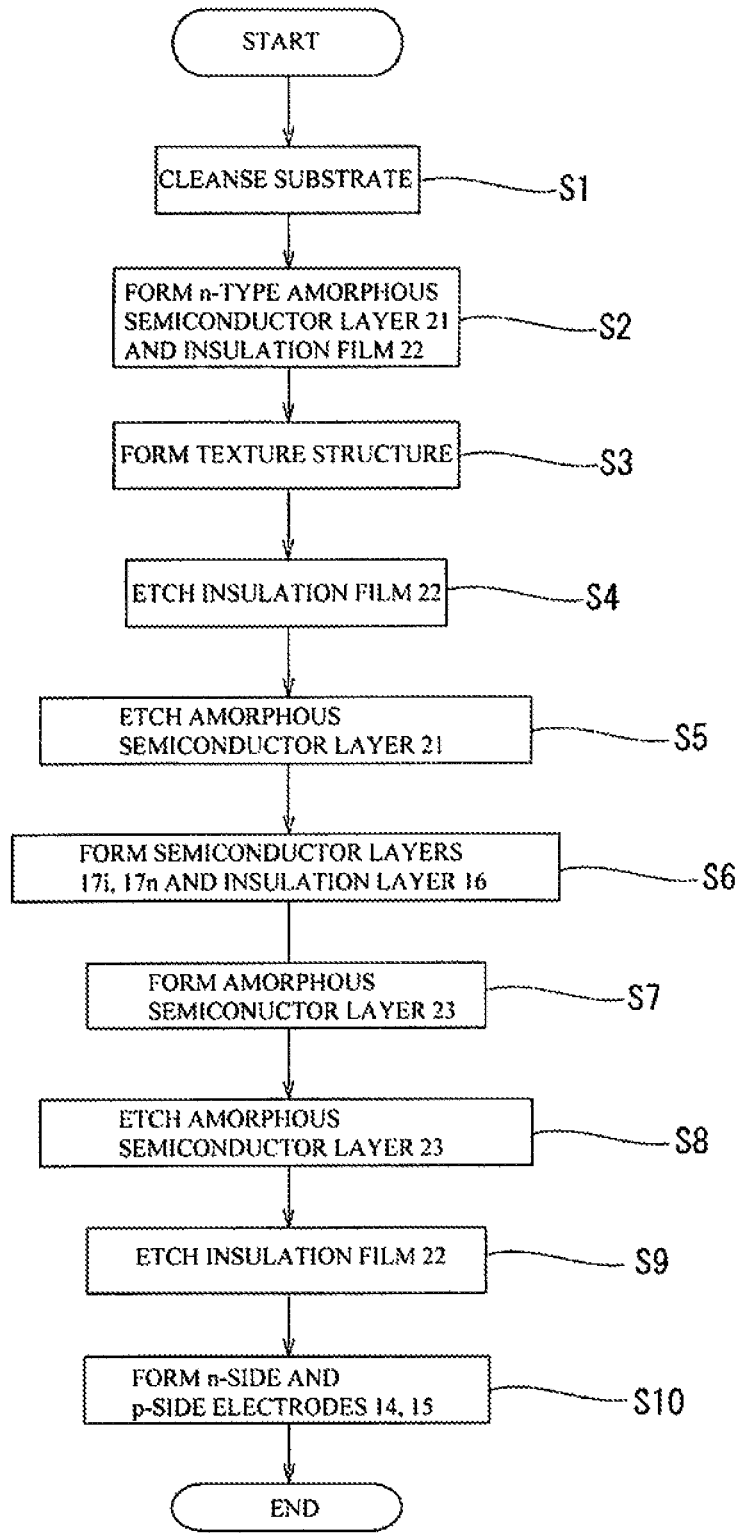
FIG. 3 is a flowchart showing steps of manufacturing the solar cell according to the first embodiment.
Figure 4:
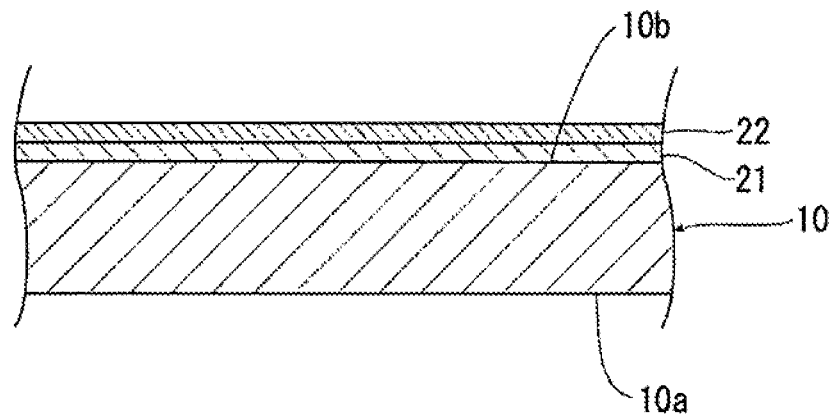
FIG. 4 is a schematic cross-sectional view for describing the steps of manufacturing the solar cell according to the first embodiment.
Figure 5:
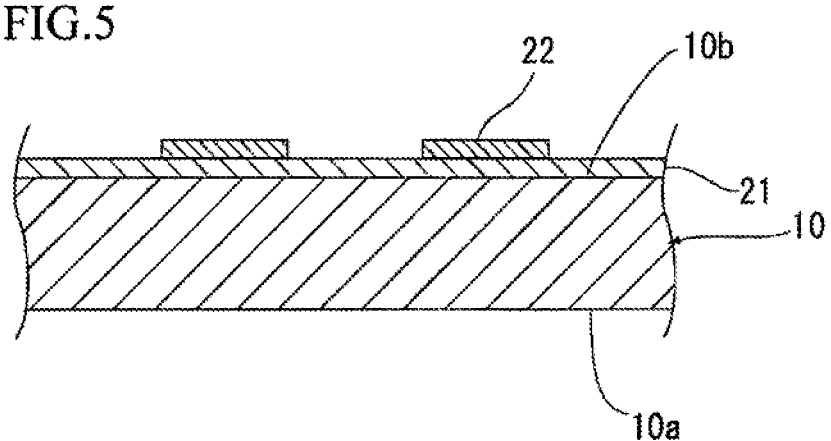
FIG. 5 is a schematic cross-sectional view for describing the steps of manufacturing the solar cell according to the first embodiment.
Figure 6:
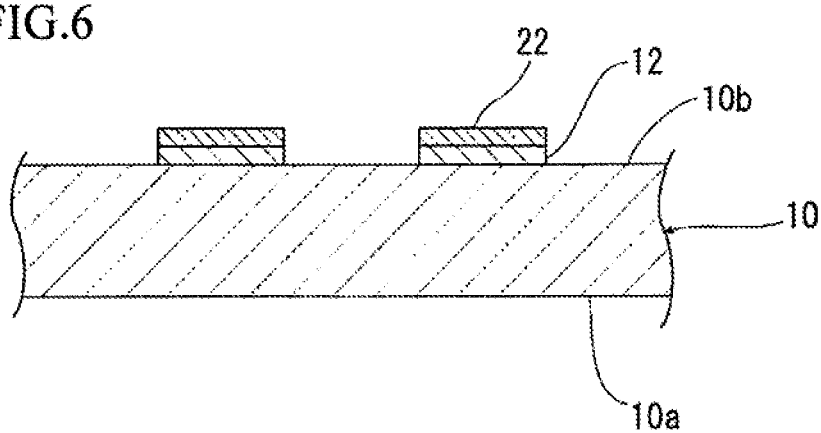
FIG. 6 is a schematic cross-sectional view for describing the steps of manufacturing the solar cell according to the first embodiment.
Figure 7:
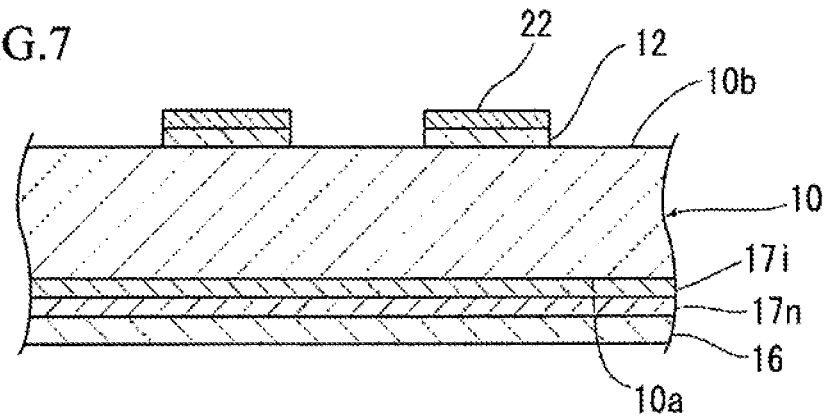
FIG. 7 is a schematic cross-sectional view for describing the steps of manufacturing the solar cell according to the first embodiment.
Figure 8:
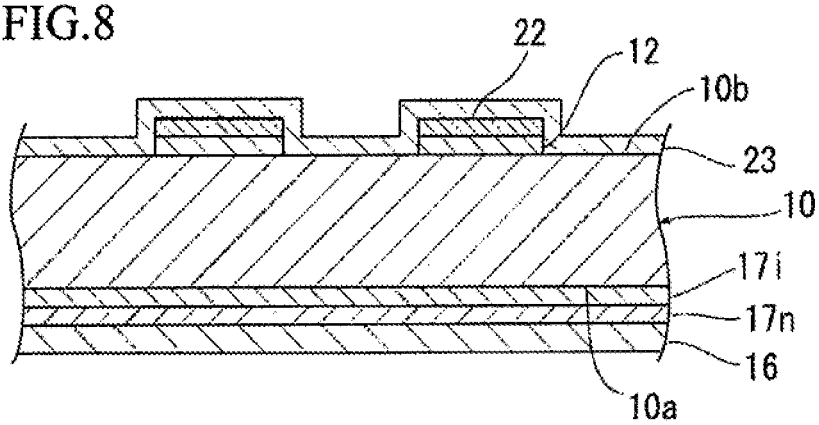
FIG. 8 is a schematic cross-sectional view for describing the steps of manufacturing the solar cell according to the first embodiment.
Figure 9:
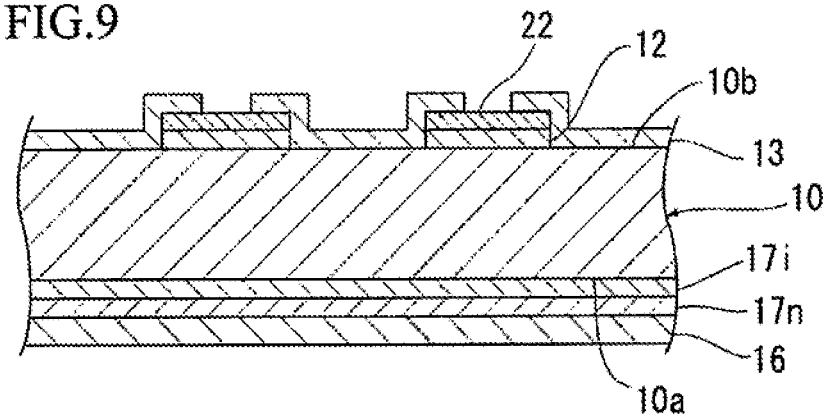
FIG. 9 is a schematic cross-sectional view for describing the steps of manufacturing the solar cell according to the first embodiment.
Figure 10:
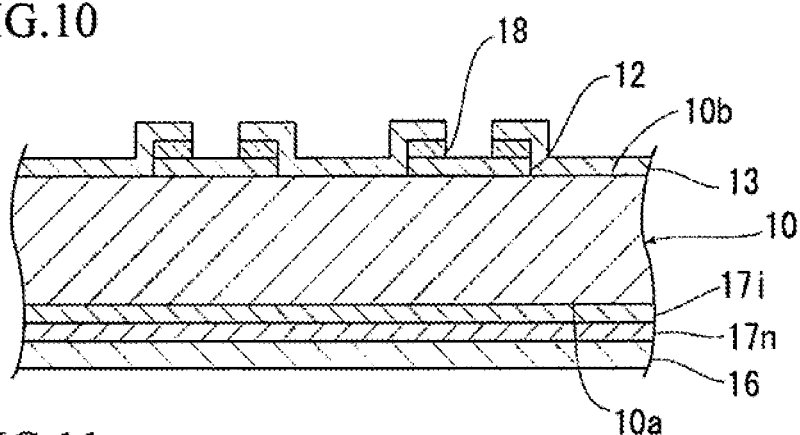
FIG. 10 is a schematic cross-sectional view for describing the steps of manufacturing the solar cell according to the first embodiment.

As shown in FIG. 2, solar cell 1 includes solar cell substrate 20. Solar cell substrate 20 includes: semiconductor substrate 10; and p-type amorphous semiconductor layer 13 and n-type amorphous semiconductor layer 12 respectively disposed in certain regions on one surface of semiconductor substrate 10.

Note that, an "amorphous semiconductor" in the invention includes a microcrystalline semiconductor. A microcrystalline semiconductor indicates an amorphous semiconductor including a large number of fine crystal grains.

Semiconductor substrate 10 includes: light-receiving surface 10a; and back surface 10b constituting a second principal surface of solar cell substrate 20. Semiconductor substrate 10 generates carriers by receiving light 11 on light-receiving surface 10a. Here, carriers refer to holes and electrons generated when light is absorbed by semiconductor substrate 10.

Semiconductor substrate 10 is formed of a crystalline semiconductor substrate of n-type or p-type conductivity. Specific examples of the crystalline semiconductor substrate include crystalline silicon substrates such as a monocrystalline silicon substrate and a polycrystalline silicon substrate, for example. Hereinbelow, this embodiment describes an example in which semiconductor substrate 10 is formed of an n-type crystalline silicon substrate.

On back surface 10b of semiconductor substrate 10, n-type amorphous semiconductor layer 12 containing an n-type dopant is disposed in a first region whereas p-type amorphous semiconductor layer 13 containing a p-type dopant is disposed in a second region. Surfaces of these n-type amorphous semiconductor layer 12 and p-type amorphous semiconductor layer 13 respectively form n-type surface 12n and p-type surface 13p on a first principal surface of solar cell substrate 20.

Note that, n-type amorphous semiconductor layer 12 and p-type amorphous semiconductor layer 13 preferably contain hydrogen. Specifically, n-type amorphous semiconductor layer 12 and p-type amorphous semiconductor layer 13 are preferably made of hydrogenated amorphous silicon. The thickness of each of n-type amorphous semiconductor layer 12 and p-type amorphous semiconductor layer 13 may be about 20 angstroms to 500 angstroms, for example.

In the invention, the "n-type surface" indicates an exposed surface of the semiconductor part of n-type conductivity; the "p-type surface" indicates an exposed surface of the semiconductor part of p-type conductivity.

Each of n-type amorphous semiconductor layer 12 and p-type amorphous semiconductor layer 13 is formed in a comb-teeth shape. On back surface 10b, n-type amorphous semiconductor layer 12 and p-type amorphous semiconductor layer 13 are arranged alternately in direction x perpendicular to intersecting width direction y. N-type amorphous semiconductor layer 12 and p-type amorphous semiconductor layer 13 adjacent in direction x are electrically insulated from each other by insulation layer 18 described later. This makes recombination of minority carriers less likely to occur, whereby high photoelectric conversion efficiency can be achieved.

Note that, in this embodiment, n-type amorphous semiconductor layer 12 and p-type amorphous semiconductor layer 13 cover substantially entire back surface 10b and constitute the first principal surface of solar cell substrate 20.

Each of width W1 of n-type amorphous semiconductor layer 12 and width W2 of p-type amorphous semiconductor layer 13 may be about 100 μm to 1.5 mm, for example. Width W1 and interval W2 may be equal and may be different. Here, it is preferable that width W2 of p-type amorphous semiconductor layer 13 of different conductivity from that of semiconductor substrate 10 be larger than width W1 of n-type amorphous semiconductor layer 12 of the same conductivity as that of semiconductor substrate 10.

In addition, an intrinsic amorphous semiconductor (an intrinsic semiconductor is hereinafter referred to as an "i-type semiconductor") layer having a thickness of about several angstroms to 250 angstroms for example, which virtually does not contribute to power generation, may be formed between semiconductor substrate 10 and each of n-type amorphous semiconductor layer 12 and p-type amorphous semiconductor layer 13. The i-type amorphous semiconductor layer may be formed of i-type amorphous silicon containing hydrogen, for example.

In this embodiment, p-type amorphous semiconductor layer 13 is disposed above each of both end portions in x direction of n-type amorphous semiconductor layer 12. Insulation layer 18 is disposed in a space formed between portions of n-type amorphous semiconductor layer 12 and p-type amorphous semiconductor layer 13 overlapping each other in z direction. Width W3 of insulation layer 18 in direction x is not particularly limited, but may be set about one-third of width W1 for example. Interval W4 of insulation layer 18 in direction x is also not particularly limited, but may be set about one-third of width W1 for example.

A material of insulation layer 18 is not particularly limited. For example, insulation layer 18 may be made of silicon oxide, silicon nitride, or silicon oxynitride. Among these, insulation layer 18 is preferably made of silicon nitride.

Further, insulation layer 18 preferably contains hydrogen.

N-side electrode 14 for collecting electrons is disposed on n-type amorphous semiconductor layer 12, whereas p-side electrode 15 for collecting holes is disposed on p-type amorphous semiconductor layer 13. These n-side electrode 14 and p-side electrode 15 are insulated from each other above the surface of insulation layer 18.

Here, interval W5 formed between n-side electrode 14 and p-side electrode 15 above insulation layer 18 may be set about one-third of width W3, for example.

As described previously, in this embodiment, each of n-type amorphous semiconductor layer 12 and p-type amorphous semiconductor layer 13 is formed in a comb-teeth shape. Hence, each of n-side electrode 14 and p-side electrode 15 is formed in a comb-teeth shape including a bus bar portion and multiple finger portions. Instead, each of n-side electrode 14 and p-side electrode 15 maybe a so-called bus-bar-less electrode formed only of multiple finger portions without a bus bar portion.

Note that, a material and a structure of each of n-side electrode 14 and p-side electrode 15 are not particular limited as long as these are capable of collecting carriers. Each of n-side electrode 14 and p-side electrode 15 may be made of a conductive material such as Transparent Conductive Oxide (TCO), metal such as Ag, Cu, Sn, Pt, or Au, or an alloy containing one or more of these types of metal, for example. Alternatively, each of n-side electrode 14 and p-side electrode 15 may be formed of a multilayer including multiple conductive films. In this case, n-side electrode 14 or p-side electrode 15 is preferably formed of: a multilayer body including a TCO layer formed on n-type amorphous semiconductor layer 12 or p-type amorphous semiconductor layer 13; and at least one metal or alloy layer formed on the TCO layer.

The method of forming each of n-side electrode 14 and p-side electrode 15 is also not particularly limited. Each of n-side electrode 14 and p-side electrode 15 maybe formed by, for example, a thin-film formation method such as a sputtering method, a CVD method, or another deposition method, a plating method, or a combination of these methods.

Light-receiving surface 10a of semiconductor substrate 10, which constitutes a second principal surface of solar cell substrate 20, has a texture structure. Here, a texture structure refers to a bumpy structure formed to reduce surface reflection and increase the amount of optical absorption by solar cell substrate 20. For example, the texture structure is a pyramidal (quadrangular pyramidal/truncated quadrangular pyramidal) bumpy structure made by performing anisotropic etching on a monocrystalline silicon substrate having a (100) plane.

I-type amorphous semiconductor layer 17i is disposed on textured light-receiving surface 10a. In this embodiment, i-type amorphous semiconductor layer 17i is specifically made of i-type amorphous silicon containing hydrogen. The thickness of i-type amorphous semiconductor layer 17i is not particularly limited as long as this virtually does not contribute to power generation. The thickness of i-type amorphous semiconductor layer 17i may be about several angstroms to 250 angstroms, for example.

N-type amorphous semiconductor layer 17n having the same conductivity as semiconductor substrate 10 is disposed on i-type amorphous semiconductor layer 17i. N-type amorphous semiconductor layer 17n is an amorphous semiconductor layer of n-type conductivity containing an n-type dopant. More specifically, in this embodiment, n-type amorphous semiconductor layer 17n is made of n-type amorphous silicon containing hydrogen. The thickness of n-type amorphous semiconductor layer 17n is not particularly limited, but may be about 20 angstroms to 500 angstroms, for example.

Insulation layer 16 serving both as an antireflection film and a protection film is formed on n-type amorphous semiconductor layer 17n. Insulation layer 16 may be made of a material such as silicon oxide, silicon nitride, or silicon oxynitride, for example. The thickness of insulation layer 16 may be set as appropriate according to antireflection characteristics intended to be given to this layer. The thickness of insulation layer 16 may be selected as appropriate from the range of 80 nm to 1 μm, for example.

Subsequently, a method of manufacturing solar cell 1 of this embodiment is described with referring mainly to FIGS. 3 to 10.

First of all, semiconductor substrate 10 having light-receiving surface 10a and back surface 10b is prepared. Next, in Step S1, light-receiving surface 10a and back surface 10b of semiconductor substrate 10 are cleansed. Semiconductor substrate 10 may be cleansed using a HF aqueous solution, for example. Light-receiving surface 10a and back surface 10b of semiconductor substrate 10 subjected to cleansing each have a substantially flat surface.

Next, in Step S2, n-type amorphous semiconductor layer 21 and insulation film 22 are formed in this order on substantially entire back surface 10b of semiconductor substrate 10. The method of forming each of n-type amorphous semiconductor layer 21 and insulation film 22 is not particularly limited. N-type amorphous semiconductor layer 21 may be formed by a thin-film formation method such as a Chemical Vapor Deposition (CVD) method typified by a plasma CVD method, for example. In the meantime, insulation film 22 may be formed by a thin-film formation method such as a sputtering method or a CVD method, for example. In order to reduce manufacturing costs or prevent impurities from getting mixed in these layer and film, it is preferable to form n-type amorphous semiconductor layer 21 and insulation film 22 consecutively while maintaining a vacuum state.

Then, in Step S3, a texture structure is formed in light-receiving surface 10a of semiconductor substrate 10 constituting the second principal surface of solar cell substrate 20. The method of forming the texture structure is not particularly limited. For example, the texture structure may be formed by etching light-receiving surface 10a of semiconductor substrate 10 with an etching agent. More specifically, the texture structure may be formed in light-receiving surface 10a by immersing semiconductor substrate 10 in an etchant or by placing semiconductor substrate 10 in an etching gas, for example.

In this Step S3, back surface 10b of semiconductor substrate is coated with insulation film 22. The etching rate of insulation film 22 with an etching agent is lower than the etching rate of semiconductor substrate 10. For this reason, insulation film 22 acts as a protection film, and protects n-type amorphous semiconductor layer 21 and back surface 10b favorably. Thereby, n-type amorphous semiconductor layer 21 and back surface 10b are prevented from being etched with the etching agent. As a result, back surface 10b of semiconductor substrate 10 is kept substantially flat. This insulation film 22 is processed in a later step and becomes insulation layer 18 being a component of solar cell 1. N-type amorphous semiconductor layer 21 is also processed in a later step and becomes n-type amorphous semiconductor layer 12.

As described above, this embodiment makes it possible to favorably protect back surface 10b upon forming the texture structure, by using a member used for forming a component of solar cell 1 and without additionally forming a protection layer for protecting back surface 10b. Accordingly, the manufacturing method of this embodiment enables solar cell 1 to be manufactured easily and in fewer steps.

Note that, an "etching agent" in the invention includes an etchant, etching paste, etching ink, and so on.

In addition, although any of a wet etching method and a dry etching method may be used to etch the back surface of the semiconductor substrate in the invention, it is preferable to use wet etching to etch the back surface of the semiconductor substrate from the viewpoint of productivity.

One of etching agents used favorably for forming the texture structure is an anisotropic etching solution. In the case where a monocrystalline silicon substrate having a (100) plane is used as semiconductor substrate 10, an alkali solution such as an NaOH solution or a KOH solution may be used as an anisotropic etching solution, for example.

An isotropic etching solution may also be used favorably for forming the texture structure. Any solution may be used for forming the texture structure as long as this is generally used to perform isotropic etching on a semiconductor wafer.

Specific examples of an isotropic etching solution favorably used include HF, $HNO_3$, or a mixture of these. In addition, phosphoric acid, acetic acid, or a mixture of each of these and water is favorably used as an isotropic etching solution. As an etching agent, a mixed reaction gas of a fluorine-based gas such as $CF_4$ or $NF_3$ and a chlorine-based gas such as $Cl_2$ may also be used.

The etching rate of semiconductor substrate 10 with an etching agent is preferably 1.1 times or more higher than, more preferably 1.5 times or more higher than, or still more preferably 2 times or more higher than the etching rate of insulation film 22 with an etching agent, although it varies depending on the thickness of insulation film 22.

Next, in Step S4, insulation film 22 is subjected to removal processing by used of a predetermined pattern to remove part of insulation film 22. More specifically, a portion of insulation film 22, which is located in a region where the p-type amorphous semiconductor layer is to be joined to semiconductor substrate 10 in the following step, is removed.

Insulation film 22 may be removed by etching, for example. An etching agent used for etching is preferably one such that the etching rate of insulation film 22 is higher than the etching rate of semiconductor substrate 10. An etching agent used for etching insulation film 22 is one such that the etching rate of insulation film 22 is preferably 1.1 times or more higher than, more preferably 1.5 times or more higher than, or still more preferably 2 times or more higher than the etching rate of semiconductor substrate 10.

To be more specific, in the case where insulation film 22 is made of silicon oxide, silicon nitride, or silicon oxynitride, insulation film 22 may be etched using an acid etchant such as an HF aqueous solution.

Thereafter, in Step S5, a part of n-type amorphous semiconductor layer 21 is removed with patterned insulation film 22 patterned in Step S4 used as a mask, whereby n-type amorphous semiconductor layer 21 is removed except for a portion covered with insulation film 22. In this way, back surface 10b is exposed except for a portion having insulation film 22 above, and n-type amorphous semiconductor layer 12 is formed out of semiconductor layer 21. Here, n-type amorphous semiconductor layer 21 may be removed by etching, for example. Examples of an etching agent preferably used for etching n-type amorphous semiconductor layer 21 include an alkali etchant containing sodium hydroxide, for example.

Subsequently, in Step S6, i-type amorphous semiconductor layer 17i, n-type amorphous semiconductor layer 17n, and insulation layer 16 are formed in this order on substantially entire light-receiving surface 10a of semiconductor substrate 10 having the texture structure. Semiconductor layers 17i and 17n may be formed by a CVD method such as a plasma CVD method, for example. On the other hand, insulation layer 16 may be formed by a thin-film formation method such as a sputtering method or a CVD method, for example. In order to reduce manufacturing costs or prevent impurities from getting mixed in these layers, it is preferable to form i-type amorphous semiconductor layer 17i, n-type amorphous semiconductor layer 17n, and insulation layer 16 consecutively while maintaining a vacuum state.

Next, in Step S7, p-type amorphous semiconductor layer 23 is formed to cover back surface 10b and the surface of insulation film 22. The method of forming p-type amorphous semiconductor layer 23 is not particularly limited. P-type amorphous semiconductor layer 23 may be formed by a thin-film formation method such as a CVD method, for example.

Then, in Step S8, a portion of p-type amorphous semiconductor layer 23 located on insulation film 22 is removed by etching or the like. Thereby, p-type amorphous semiconductor layer 13 is formed out of p-type amorphous semiconductor layer 23.

An etching agent used in this Step S8 is one such that the etching rate of amorphous semiconductor layer 23 is higher than the etching rate of insulation film 22. Due to this, of insulation film 22 and amorphous semiconductor layer 23, amorphous semiconductor layer 23 is selectively etched.

An etching agent used in Step S8 is one such that the etching rate of p-type amorphous semiconductor layer 23 is 1.1 times or more higher than, preferably 1.5 times or more higher than, or more preferably 2 times or more higher than the etching rate of insulation film 22. Still more preferably, an etching agent used in Step S8 is one with which p-type amorphous semiconductor layer 23 is etched but insulation film 22 is not substantially etched. In the case where p-type amorphous semiconductor layer 23 is made of silicon and insulation film 22 is made of silicon oxide, silicon nitride, or silicon oxynitride, specific examples of such an etching agent include an alkali aqueous solution such as an NaOH aqueous solution containing NaOH, for example.

Thereafter, in Step S9, insulation film 22 is removed by etching or the like. More specifically, while amorphous semiconductor layer 13 formed out of amorphous semiconductor layer 23 part of which is removed by etching in Step S8 is used as a mask, an exposed portion of insulation film 22 is etched with an etching agent and removed. Thereby, insulation layer 18 is formed out of insulation film 22, and part of n-type amorphous semiconductor layer 12 is exposed. Here, one of etching agents preferably used to remove insulation film 22 is an HF aqueous solution, for example.

Subsequently, in Step S10, an electrode formation step(s) is performed in which n-side electrode 14 and p-side electrode 15 are formed respectively on n-type amorphous semiconductor layer 12 and p-type amorphous semiconductor layer 13. Thus, solar cell 1 is completed.

The method of forming each of n-side electrode 14 and p-side electrode 15 may be selected as appropriate according to materials of the electrodes. Each of n-side electrode 14 and p-side electrode 15 may be formed by a thin-film formation method such as a sputtering method, a CVD method, or another deposition method, a plating method, a method of coating conductive paste, or a combination of these methods, for example. Alternatively, n-side electrode 14 and p-side electrode 15 may be formed by, for example, forming a conductive layer in such a way that the conductive layer covers n-type amorphous semiconductor layer 12 and p-type amorphous semiconductor layer 13, and dividing the conductive layer at positions on insulation layer 18. In this case, n-side electrode 14 and p-side electrode 15 can be formed at small pitches and with high accuracy in shape.

As described above, in this embodiment, insulation film 22 for protecting back surface 10b upon forming the texture structure in light-receiving surface 10a also acts as an insulation film for electrically isolating n-side electrode 14 and p-side electrode 15 from each other. Accordingly, this embodiment makes it possible to favorably protect back surface 10b when the texture structure is formed, by using a member used for forming one of the components of solar cell 1, without forming an additional protection film for protecting back surface 10b. Thus, the manufacturing method of this embodiment enables solar cell 1 to be manufactured easily and in fewer steps.

Hereinafter, another example of preferred embodiments of the invention is described. Note that, in the following description, members having substantially the same functions as those of the first embodiment are given the same reference numerals and description thereof is omitted.

<Second Embodiment>

Figure 11:
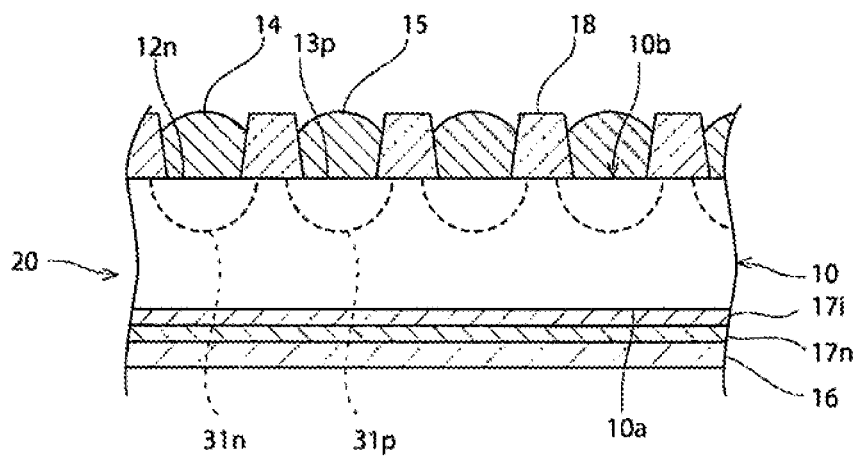
FIG. 11 is a schematic cross-sectional view of a solar cell according to a second embodiment.

In the first embodiment, a description is given of an example where solar cell substrate 20 includes semiconductor substrate 10 and amorphous semiconductor layers 12 and 13. However, the invention is not limited to this configuration. For example, as shown in FIG. 11, solar cell substrate 20 may include semiconductor substrate 10 in which p-type dopant diffusion portion 31n and n-type dopant diffusion portion 31p exposed to back surface 10b are formed. In this case, solar cell 1 may be manufactured in the following way.

First, p-type diffusion paste is used to diffuse a p-type dopant in semiconductor substrate 10 from one portion of one principal surface thereof, and n-type diffusion paste is used to diffuse an n-type dopant in semiconductor substrate 10 from at least part of the other portion of the one principal surface. With this process, p-type dopant diffusion portion 31n and n-type dopant diffusion portion 31p are formed in semiconductor substrate 10, and solar cell substrate 20 is thus obtained.

Figure 12:
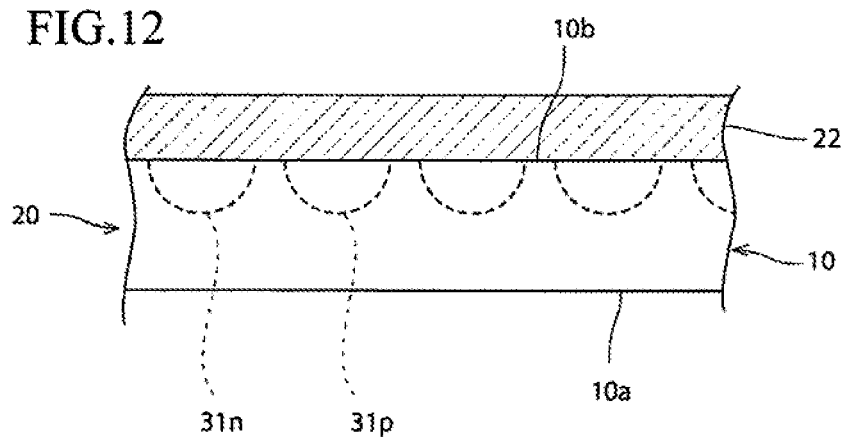
FIG. 12 is a schematic cross-sectional view for describing steps of manufacturing the solar cell according to the second embodiment.

Next, as shown in FIG. 12, insulation film 22 is formed on back surface 10b of semiconductor substrate 10. Thereafter, a texture structure is formed in light-receiving surface 10a of semiconductor substrate 10.

Figure 13:
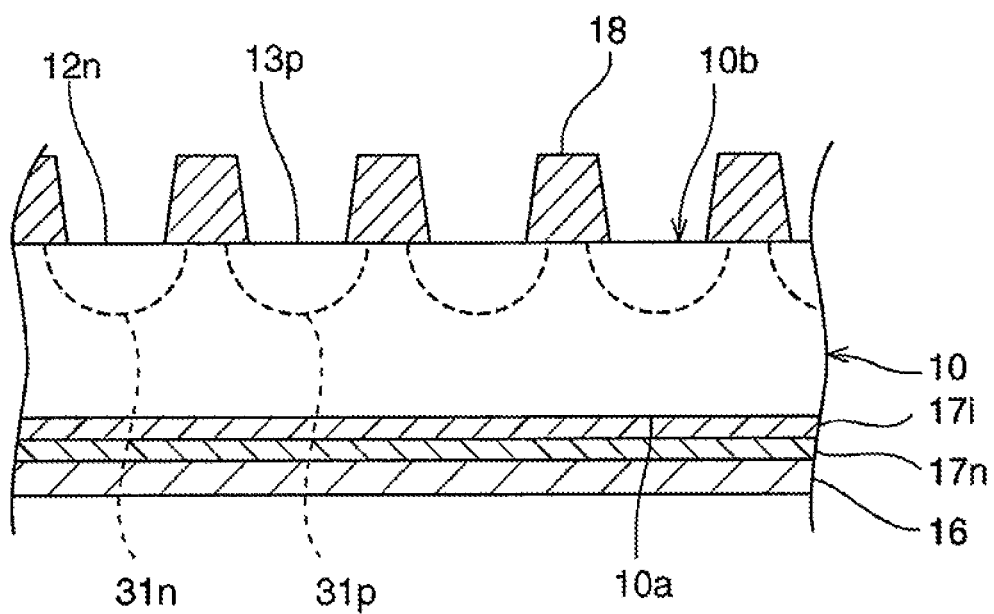
FIG. 13 is a schematic cross-sectional view for describing the steps of manufacturing the solar cell according to the second embodiment.

Then, as shown in FIG. 13, p-type dopant diffusion portion 31n and n-type dopant diffusion portion 31p are exposed by removing at least part of a portion of insulation film 22, the portion being located on p-type dopant diffusion portion 31n and n-type dopant diffusion portion 31p.

After that, n-side electrode 14 and p-side electrode 15 are formed on p-type dopant diffusion portion 31n and n-type dopant diffusion portion 31p, thereby completing the solar cell.

In this embodiment as well, insulation film 22 for protecting back surface 10b when the texture structure is formed also acts as an insulation film for electrically isolating n-side electrode 14 and p-side electrode 15 from each other and as a passivation film for semiconductor substrate 10.

Accordingly, this embodiment also makes it possible to protect back surface 10b favorably when a texture structure is formed, by using a member used for forming a component of solar cell 1 and without additionally forming a protection layer for protecting back surface 10b. Thus, the manufacturing method of this embodiment enables solar cell 1 to be manufactured easily and in fewer steps.

Explanation Of Reference Numerals 1 solar cell
10 semiconductor substrate
10a light-receiving surface
10b back surface
12 n-type amorphous semiconductor layer
12n n-type surface
13 p-type amorphous semiconductor layer
13p p-type surface
14 n-side electrode
15 p-side electrode
18 insulation layer
20 solar cell substrate
21 n-type amorphous semiconductor layer
22 insulation film
23 p-type amorphous semiconductor layer
31n p-type dopant diffusion portion
31p n-type dopant diffusion portion The invention claim is:

1. A method to manufacture a solar cell including: a solar cell substrate including a semiconductor substrate, a first principal surface with a p-type surface and an n-type surface, and a textured second principal surface; a p-side electrode disposed on the p-type surface; an n-side electrode disposed on the n-type surface; and an insulation layer formed on the first principal surface and isolating the p-side electrode and the n-side electrode from each other, the method comprising:
   forming a first semiconductor layer of a first conductivity on the first principal surface of the semiconductor substrate;
   forming an insulation film on the first semiconductor layer;
   forming the texture structure in the second principal surface;
   partly removing the insulation film and the first semiconductor layer to thereby expose part of the first principal surface; and
   forming a second semiconductor layer of a second conductivity to cover the insulation layer and the exposed part of the first principal surface, thereby obtaining the solar cell substrate including the semiconductor substrate, the first semiconductor layer, and the second semiconductor layer.

2. The method of manufacturing the solar cell according to claim 1, wherein the insulation film is used as a protection film protecting the first principal surface when the texture structure is formed in the second principal surface.

3. The manufacturing method according to claim 1, wherein
   the texture structure is formed by etching the second principal surface with an etching agent, and
   the insulation film formed is an insulation film whose etching rate with the etching agent is lower than an etching rate of the semiconductor substrate with the etching agent.

4. The manufacturing method according to claim 1, wherein the insulation film is made of any one of silicon oxide, silicon nitride, and silicon oxynitride.

5. The manufacturing method according to claim 1, wherein
   the first semiconductor layer is exposed by partly removing the insulation film and a portion of the second semiconductor layer located on the insulation film, and then
   the p-side electrode and the n-side electrode are formed.

6. The manufacturing method according to claim 1, wherein the p-side electrode and the n-side electrode are formed by:
   forming a conductive layer covering the first and second semiconductor layers and the insulation layer, and
   dividing the conductive layer at positions on the insulation layer.

7. The method of manufacturing a solar cell according to claim 1, wherein at least one of the first and second semiconductor layers is made of an amorphous semiconductor.

8. The manufacturing method according to claim 7, further comprising
   forming an intrinsic amorphous semiconductor layer between the semiconductor substrate and at least one of the first and second semiconductor layers made of the amorphous semiconductor.

9. The manufacturing method according to claim 1, further comprising:
   diffusing p-type dopant in the semiconductor substrate from one portion of one principal surface thereof, and diffusing an n-type dopant in the semiconductor substrate from at least part of the other portion of the one principal surface; and
   forming the texture structure in the other principal surface, thereby obtaining the solar cell substrate.

10. The manufacturing method according to claim 1, wherein a crystalline semiconductor substrate is used as the semiconductor substrate.

\* \* \* \* \*